United States Patent
Ogawa et al.

(10) Patent No.: US 8,502,530 B2
(45) Date of Patent: Aug. 6, 2013

(54) OFFSET CANCELLING CIRCUIT

(75) Inventors: Takashi Ogawa, Ogaki (JP); Hironori Terazawa, Ichinomiya (JP); Takahisa Nakai, Ogaki (JP)

(73) Assignees: Sanyo Semiconductor Co., Ltd. (JP); Semiconductor Components Industries, LLC, Phoenix, AZ (US)

( * ) Notice: Subject to any disclaimer, the term of this patent is extended or adjusted under 35 U.S.C. 154(b) by 338 days.

(21) Appl. No.: 12/795,779

(22) Filed: Jun. 8, 2010

(65) Prior Publication Data

US 2010/0308801 A1  Dec. 9, 2010

(30) Foreign Application Priority Data

Jun. 8, 2009 (JP) ................................. 2009-136907

(51) Int. Cl.
*G01R 33/06* (2006.01)

(52) U.S. Cl.
USPC .......................................... 324/251; 327/511

(58) Field of Classification Search
USPC .......................................... 324/251; 327/511
See application file for complete search history.

(56) References Cited

U.S. PATENT DOCUMENTS

| | | | | |
|---|---|---|---|---|
| 6,727,693 | B2 * | 4/2004 | Altrichter et al. | 324/251 |
| 6,777,932 | B2 * | 8/2004 | Hara et al. | 324/251 |
| 7,425,821 | B2 * | 9/2008 | Monreal et al. | 324/117 H |
| 7,511,484 | B2 * | 3/2009 | Oohira et al. | 324/251 |
| 7,659,716 | B2 * | 2/2010 | Nishikawa | 324/244 |
| 7,701,208 | B2 * | 4/2010 | Nishikawa | 324/251 |
| 8,085,035 | B2 * | 12/2011 | Namai et al. | 324/207.2 |
| 8,134,358 | B2 * | 3/2012 | Charlier et al. | 324/251 |

FOREIGN PATENT DOCUMENTS

| | | |
|---|---|---|
| JP | 9-329460 A | 12/1997 |
| JP | 2004-37221 A | 2/2004 |
| JP | 2009-31027 A | 2/2009 |
| WO | 2006/085503 A1 | 8/2006 |

OTHER PUBLICATIONS

Notice of Grounds for Rejection for Japanese Patent Application No. 2009-136907; Mailing Date: May 14, 2013, with English Translation.

* cited by examiner

*Primary Examiner* — Reena Aurora
(74) *Attorney, Agent, or Firm* — Cantor Colburn LLP

(57) ABSTRACT

In an offset cancelling circuit of a Hall element, a voltage is applied from four directions and from outside such that a current flowing in the Hall element is switched by 90°, to set a first state through a fourth state, and output voltages of the Hall element in the first state through the fourth state are averaged.

1 Claim, 5 Drawing Sheets

US 8,502,530 B2

OFFSET CANCELLING CIRCUIT

CROSS-REFERENCE TO RELATED APPLICATIONS

The entire disclosure of Japanese Patent Application No. 2009-136907 filed on Jun. 8, 2009, including specification, claims, drawings, and abstract, is incorporated herein by reference in its entirety.

BACKGROUND

1. Technical Field

The present invention relates to an offset cancelling circuit which is used for adjustment of an output or the like of a Hall element.

2. Related Art

In recent years, image capturing devices such as a digital still camera and a digital video camera realize higher image quality by increasing the number of pixels of an image capturing element of the image capturing device. On the other hand, as another method for realizing higher image quality of the image capturing device, it is desired to equip the image capturing device with a vibration absorption control circuit having a shake correction function in order to prevent shaking of imaging target caused by shaking of the hand holding the image capturing device.

A vibration absorption control circuit for shake correction receives a signal from a gyro sensor which detects an angular velocity component generated by vibration of the image capturing device, and drives optical components such as a lens and an image capturing element according to the received signal, to prevent shaking of the imaging target. With such a configuration, even if the image capturing device vibrates, the component of the vibration is not reflected in the obtained image signal, and a high-quality image signal having no image shaking can be obtained.

In this process, a Hall element is used for detecting a position of the optical component such as the lens which is driven. As shown in FIG. 8, an equivalent circuit of the Hall element 10 can be represented as a bridge circuit of resistors R1~R4. Because of this, an output signal of the Hall element 10 includes an offset component due to influences of variations in the resistors, according to a combination of a terminal on which a power supply voltage Vcc is applied and a terminal from which the output signal is extracted.

In consideration of this, an offset cancelling circuit is used which applies a voltage such that currents flowing in the Hall element 10 differ by 90°, and adds and calculates an average of the output voltages. When the current flowing in the Hall element 10 is changed by 90°, the offset of the output voltage of the Hall element 10 occurs in an opposite direction, and thus the offset value of the output voltage of the Hall element 10 is cancelled.

The offset cancelling circuit of the related art assumes that no change occurs in the resistors R1~R4 of the equivalent circuit of the Hall element in a first state and a second state.

However, in a normal Hall element, there is a voltage dependency of the resistors R1~R4. As shown in FIG. 9, the resistors R1~R4 are represented as an N-type semiconductor element in which a P-type substrate is grounded. When the terminal A is grounded, Vcc is applied to the terminal B, and Vcc/2 is applied to the terminal D as shown in FIG. 9, there is a difference in a depth in a depletion layer (channel) X formed in the element, and thus the resistors R1~R4 have a voltage dependency. In other words, the values of resistors R1~R4 would vary depending on the combination of the voltages applied to the terminals A~D.

In such a case, the offset value of the output voltage of the Hall element cannot be accurately cancelled with the offset cancelling circuit of the related art.

SUMMARY

According to one aspect of the present invention, there is provided an offset cancelling circuit for a Hall element, wherein voltages are applied from four directions and from outside such that a current flowing in the Hall element is switched by 90° to achieve a first state through a fourth state, and output voltages of the Hall element in the first state through the fourth state are averaged.

BRIEF DESCRIPTION OF THE DRAWINGS

A preferred embodiment of the present invention will be described in further detail based on the following drawings, wherein.

DETAILED DESCRIPTION

Figure 1:
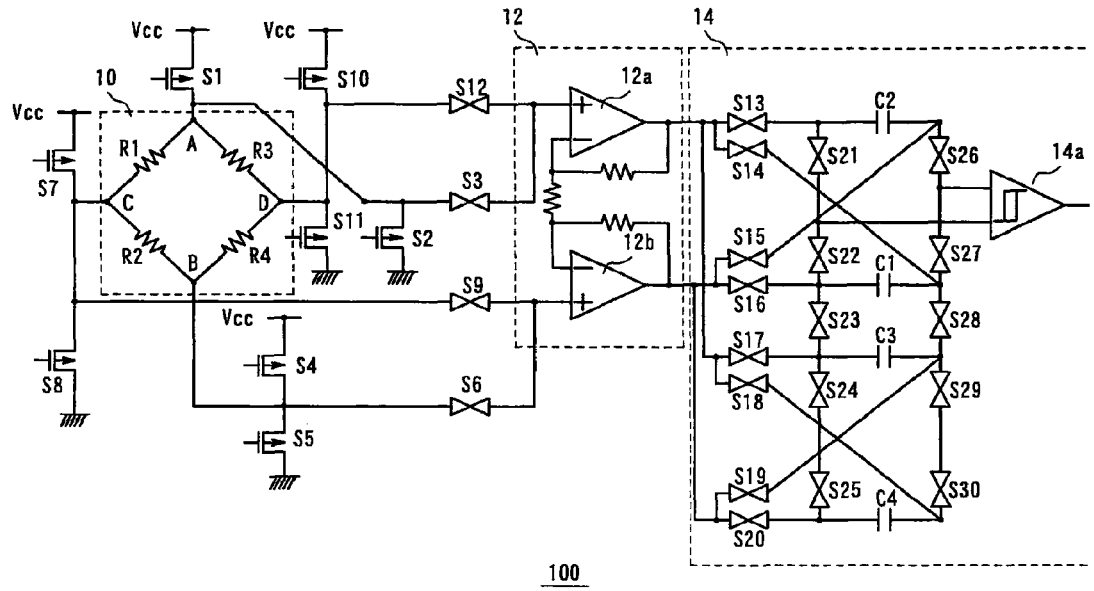
FIG. 1 is a diagram showing a structure of an offset cancelling circuit according to a preferred embodiment of the present invention.

FIG. 1 shows a basic structure of an offset cancelling circuit (OC circuit) 100 of a Hall element. The offset cancelling circuit 100 comprises a Hall element 10, an amplifier circuit 12, and an averaging circuit 14.

The Hall element 10 can be represented as a bridge circuit of resistors R1~R4. Switching elements S1~S12 which switch connection points A~D of the resistors R1~R4 to a power supply voltage Vcc, ground, or output are connected to the resistors R1~R4.

The amplifier circuit 12 comprises operational amplifiers 12a and 12b. The operational amplifier 12a amplifies a voltage which is input to a non-inverting input terminal (+) and outputs the amplified voltage. The operational amplifier 12b amplifies a voltage which is input to a non-inverting input terminal (+) and outputs the amplified voltage.

The averaging circuit 14 comprises switching elements S13~S30, capacitors C1~C4, and an operational amplifier 14a (which may be of a Schmitt buffer type). As shown in FIG. 1, the switching elements S13~S30 connect any of output terminals of the operational amplifiers 12a and 12b, terminals of the capacitors C1~C4, and an input terminal of the operational amplifier 14a with each other.

An operation of the offset cancelling circuit 100 will now be described. The offset cancelling circuit 100 cancels the offset value of the output voltage of the Hall element 10 and outputs the resulting voltage by switching among a first state through a fourth state and an output state which will be described below.

Figure 2:
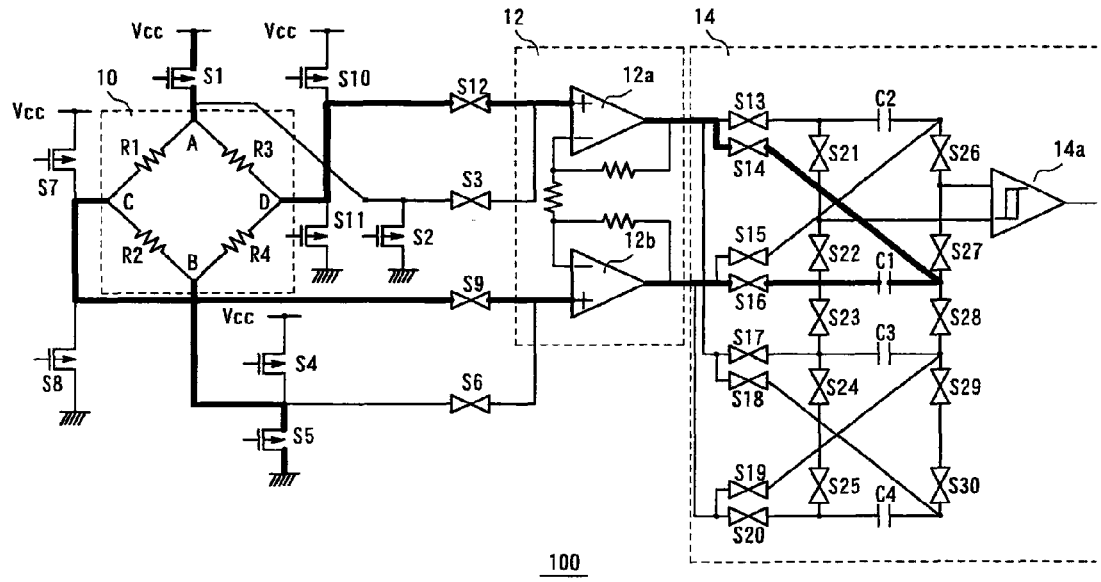
FIG. 2 is a diagram showing a first state of the offset cancelling circuit according to a preferred embodiment of the present invention.

First, as shown in FIG. 2, the switching elements S1~S30 are controlled to be switched ON and OFF, to set the offset cancelling circuit 100 to a first state. The switching element S1 is switched ON and the switching elements S2 and S3 are switched OFF to apply a power supply voltage Vcc to the connection point A of the resistors R1 and R3, the switching element S5 is switched ON and the switching elements S4 and S6 are switched OFF to connect the connection point B of the resistors R2 and R4 to the ground, the switching element S9 is switched ON and the switching elements S7 and S8 are switched OFF to connect the connection point C of the resistors R1 and R2 to the non-inverting input terminal (+) of the operational amplifier 12b, and the switching element S12 is switched ON and the switching elements S10 and S11 are switched OFF to connect the connection point D of the resistors R3 and R4 to the non-inverting input terminal (+) of the operational amplifier 12a. In addition, of the switching elements S13~S30, the switching elements S14 and S16 are switched ON and the other switching elements are switched OFF to connect the output of the operational amplifier 12a to a positive terminal of the capacitor C1 and the output of the operational amplifier 12b to a negative terminal of the capacitor C1, so as to achieve a state where the capacitor C1 is charged by the output voltages of the operational amplifiers 12a and 12b. This state is referred to as the first state.

Figure 3:
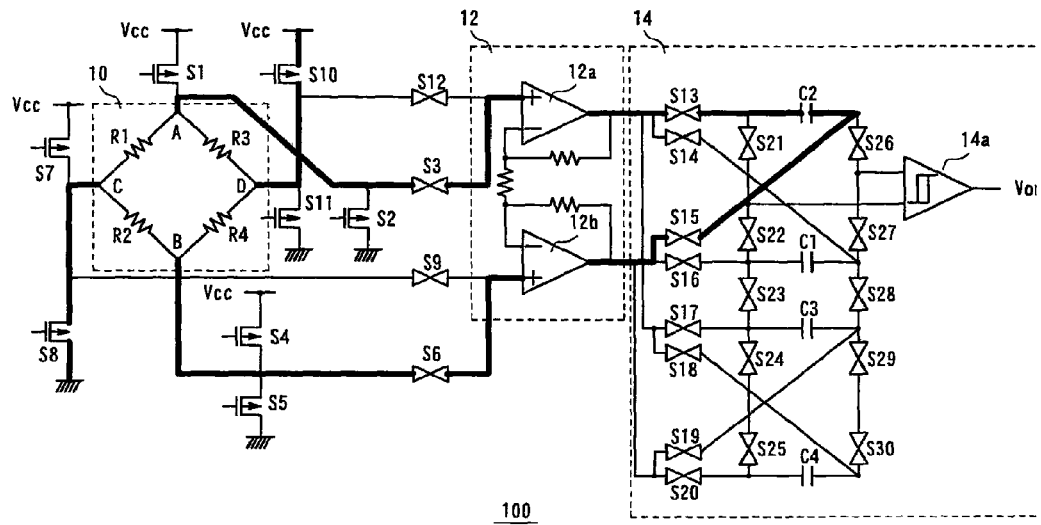
FIG. 3 is a diagram showing a second state of the offset cancelling circuit according to a preferred embodiment of the present invention.

Next, as shown in FIG. 3, the switching elements S1~S30 are controlled to be switched ON and OFF, to set the offset cancelling circuit 100 to a second state. The switching element S3 is switched ON and the switching elements S1 and S2 are switched OFF to connect the connection point A of the resistors R1 and R3 to the non-inverting input terminal (+) of the operational amplifier 12a, the switching element S6 is switched ON and the switching elements S4 and S5 are switched OFF to connect the connection point B of the resistors R2 and R4 to the non-inverting input terminal (+) of the operational amplifier 12b, the switching element S8 is switched ON and the switching elements S7 and S9 are switched OFF to connect the connection point C of the resistors R1 and R2 to ground, and the switching element S10 is switched ON and the switching elements S11 and S12 are switched OFF to apply the power supply voltage Vcc to the connection point D of the resistors R3 and R4. In addition, of the switching elements S13~S20, the switching elements S13 and S15 are switched ON and the other switching elements are switched OFF, to connect the output of the operational amplifier 12a to a negative terminal of the capacitor C2 and the output of the operational amplifier 12b to a positive terminal of the capacitor C2, so as to achieve a state where the capacitor C2 is charged by the output voltages of the operational amplifiers 12a and 12b. This state is referred to as the second state.

Figure 4:
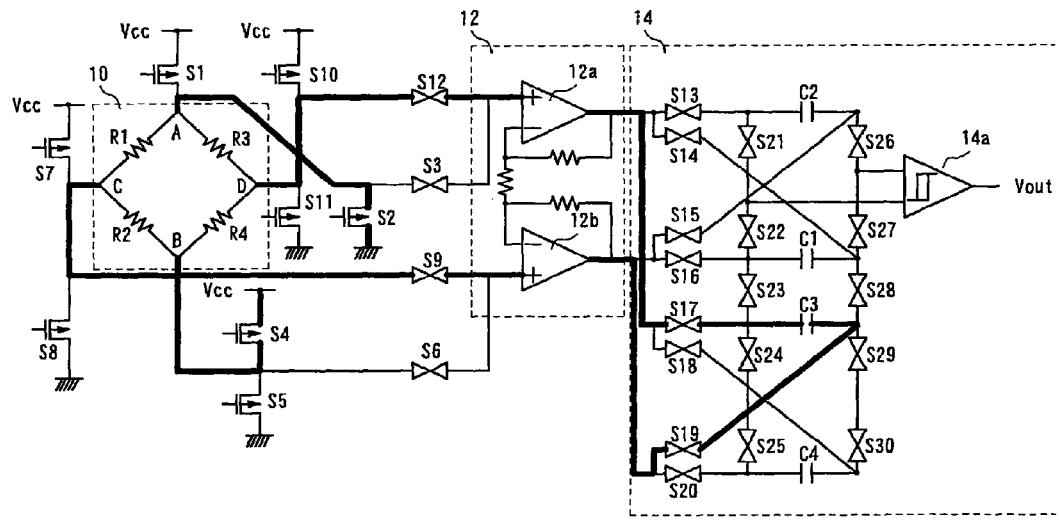
FIG. 4 is a diagram showing a third state of the offset cancelling circuit according to a preferred embodiment of the present invention.

Next, as shown in FIG. 4, the switching elements S1~S30 are controlled to be switched ON and OFF, to set the offset cancelling circuit 100 to a third state. The switching element S2 is switched ON and the switching elements S1 and S3 are switched OFF to connect the connection point A of the resistors R1 and R3 to ground, the switching element S4 is switched ON and the switching elements S5 and S6 are switched OFF to apply the power supply voltage Vcc to the connection point B of the resistors R2 and R4, the switching element S9 is switched ON and the switching elements S7 and S8 are switched OFF to connect the connection point C of the resistors R1 and R2 to the non-inverting input terminal (+) of the operational amplifier 12b, and the switching element S12 is switched ON and the switching elements S10 and S11 are switched OFF to connect the connection point D of the resistors R3 and R4 to the non-inverting input terminal (+) of the operational amplifier 12a. In addition, of the switching elements S13~S20, the switching elements S17 and S19 are switched ON and the other switching elements are switched OFF, to connect the output of the operational amplifier 12a to a negative terminal of the capacitor C3 and the output of the operational amplifier 12b to a positive terminal of the capacitor C3, so as to achieve a state where the capacitor C3 is charged by the output voltages of the operational amplifiers 12a and 12b. This state is referred to as the third state.

Figure 5:
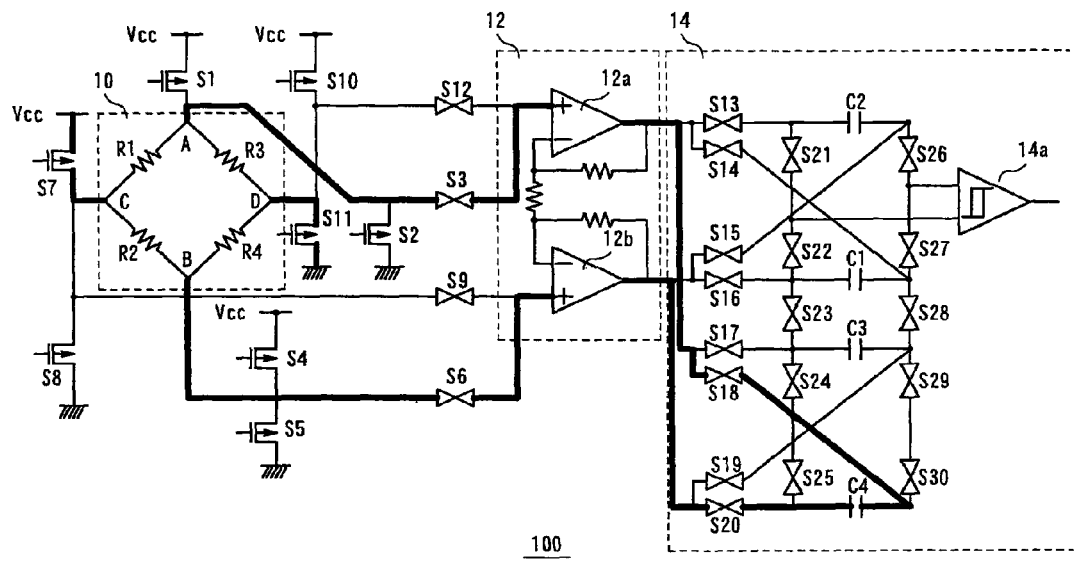
FIG. 5 is a diagram showing a fourth state of the offset cancelling circuit according to a preferred embodiment of the present invention.

Next, as shown in FIG. 5, the switching elements S1~S30 are controlled to be switched ON and OFF, to set the offset cancelling circuit 100 to a fourth state. The switching element S3 is switched ON and the switching elements S1 and S2 are switched OFF to connect the connection point A of the resistors R1 and R3 to the non-inverting input terminal (+) of the operational amplifier 12a, the switching element S6 is switched ON and the switching elements S4 and S5 are switched OFF to connect the connection point B of the resistors R2 and R4 to the non-inverting input terminal (+) of the operational amplifier 12b, the switching element S7 is switched ON and the switching elements S8 and S9 are switched OFF to apply the power supply voltage Vcc to the connection point C of the resistors R1 and R2, and the switching element S11 is switched ON and the switching elements S10 and S12 are switched OFF to connect the connection point D of the resistors R3 and R4 to ground. In addition, of the switching elements S13~S20, the switching elements S18 and S20 are switched ON and the other switching elements are switched OFF, to connect the output of the operational amplifier 12a to a positive terminal of the capacitor C4 and the output of the operational amplifier 12b to a negative terminal of the capacitor C4, so as to achieve a state where the capacitor C4 is charged by the output voltages of the operational amplifiers 12a and 12b. This state is referred to as the fourth state.

In this manner, the first through the fourth states are switched for the Hall element 10, to charge the capacitors C1~C4 with the Hall voltages V1~V4, respectively, of four directions)(360°), 90° each, for the four terminals of the Hall element 10. The offset cancelling circuit 100 is then set in an output state to average the charged voltages V1~V4 of the capacitors C1~C4, to cancel the offset value of the output voltage of the Hall element 10, and output the resulting voltage.

Figure 6:
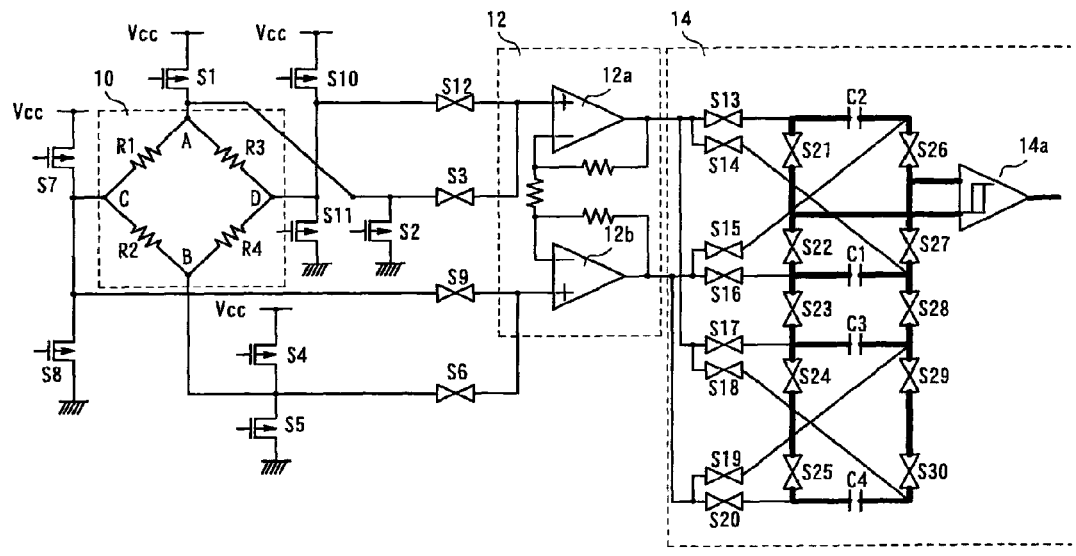
FIG. 6 is a diagram showing an output state of the offset cancelling circuit according to a preferred embodiment of the present invention.

In the output state, as shown in FIG. 6, the switching elements S13~S20 are switched OFF, to disconnect the operational amplifiers 12a and 12b and the capacitors C1~C4. In addition, the switching elements S21~S30 are switched ON to commonly connect the negative terminals of the capacitors C1~C4 to one of the input terminals of the operational amplifier 14a, and commonly connect the positive terminals of the capacitors C1~C4 to the other one of the input terminals of the operational amplifier 14a. In this manner, the charged voltages V1~V4 of the capacitors C1~C4 are averaged and output from the output terminal of the operational amplifier 14a. When the operational amplifier 14a is of a Schmitt buffer type, a high-level output and a low-level output are switched and output according to the size relationship between the two input terminals.

An operation to cancel the offset value of the output voltage of the Hall element 10 by the offset cancelling circuit 100 will now be described with reference to FIGS. 7A~7D.

Figure 7A:
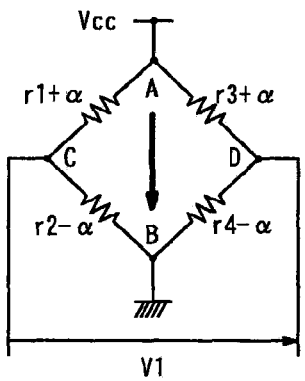
FIGS. 7A~7D are diagrams showing an action of the offset cancelling circuit according to a preferred embodiment of the present invention.

FIG. 7A shows an equivalent circuit of the Hall element 10 when the offset cancelling circuit 100 is switched to the first state. In the first state, the resistors R1 and R3 are at the high-voltage side (power supply voltage Vcc side) and the resistors R2 and R3 are at the low-voltage side (ground side). In this configuration, because of the voltage dependency of the resistors, the resistors R1 and R3 have values R1=r1+α and R3=r3+α, respectively, and similarly, the resistors R2 and R4 have values R2=r2−α and R4=R4−α, respectively. Therefore, the voltage V1 stored in the capacitor C1 is represented by the following equation (1). In the equation, an offset value which does not have a voltage dependency is represented as Voff.

[Equation 1]

$$V1 = \left(\frac{r4-\alpha}{r3+r4} - \frac{r2-\alpha}{r1+r2}\right)Vcc + Voff \quad (1)$$

Figure 7B:
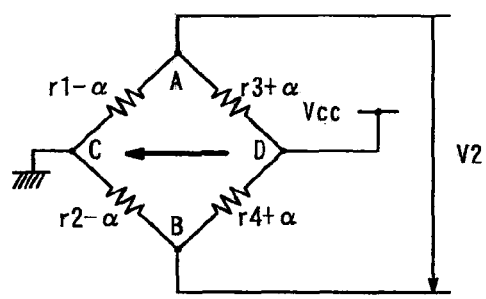

FIG. 7B shows an equivalent circuit of the Hall element 10 when the offset cancelling circuit 100 is switched to the second state. In the second state, the resistors R3 and R4 are at the high-voltage side (power supply voltage Vcc side) and the resistors R1 and R2 are at the low-voltage side (ground side). In this configuration, because of the voltage dependency of the resistors, the resistors R3 and R4 have values R3=r3+α and R4=r4+α, respectively, and similarly, the resistors R1 and R2 have values R1=r1−α and R2=r2−α, respectively. Therefore, the voltage V2 stored in the capacitor C2 is represented by the following equation (2). In this equation, the offset value which does not have the voltage dependency is represented as Voff, and the polarities are reversed from the first state because the second state is 90° rotated from the first state.

[Equation 2]

$$V2 = \left(\frac{r2-\alpha}{r2+r4} - \frac{r1-\alpha}{r1+r3}\right)Vcc + Voff \quad (2)$$

Figure 7C:
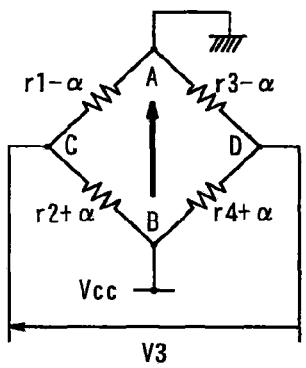

FIG. 7C shows an equivalent circuit of the Hall element 10 when the offset cancelling circuit 100 is switched to the third state. In the third state, the resistors R2 and R4 are at the high-voltage side (power supply voltage Vcc side) and the resistors R1 and R3 are at the low-voltage side (ground side). In this configuration, because of the voltage dependency of the resistors, the resistors R2 and R4 have values R2=R2+α and R4=r4+α, respectively, and similarly, the resistors R1 and R3 have values R1=r1−α and R3=r3−α, respectively. Therefore, the voltage V3 stored in the capacitor C3 is represented by the following equation (3). In this equation, the offset value which does not have the voltage dependency is represented as Voff.

[Equation 3]

$$V3 = \left(\frac{r1-\alpha}{r1+r2} - \frac{r3-\alpha}{r3+r4}\right)Vcc + Voff \quad (3)$$

Figure 7D:
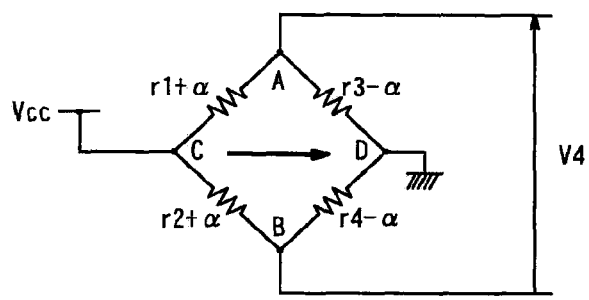
Figure 8:
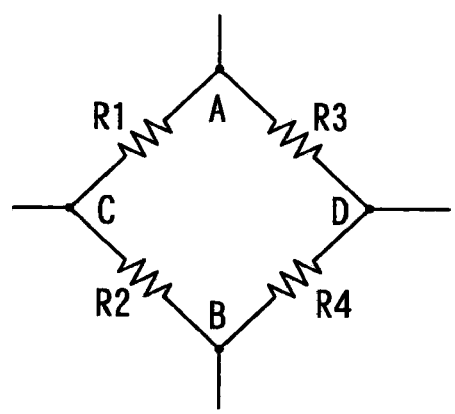
FIG. 8 is a diagram showing a structure of an offset cancelling circuit in related art.
Figure 9:
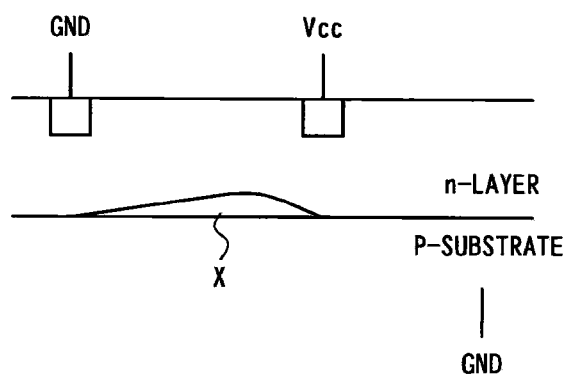
FIG. 9 is a diagram for explaining a voltage dependency of an offset value of an output voltage of a Hall element.

FIG. 7D shows an equivalent circuit of the Hall element 10 when the offset cancelling circuit 100 is switched to the fourth state. In the fourth state, the resistors R1 and R2 are at the high-voltage side (power supply voltage Vcc side) and the resistors R3 and R4 are at the low-voltage side (ground side). In this configuration, because of the voltage dependency of the resistors, the resistors R1 and R2 have values R1=r1+α and R2=r2+α, respectively, and similarly, the resistors R3 and R4 have values R3=r3−α and R4=r4−α, respectively. Therefore, the voltage V4 stored in the capacitor C4 is represented by the following equation (4). In this equation, the offset value which does not have voltage dependency is represented by Voff, and the polarities are reversed because the state is a state rotated from the third state by 90°.

[Equation 4]

$$V4 = \left(\frac{r3-\alpha}{r1+r3} - \frac{r4-\alpha}{r2+r4}\right)Vcc - Voff \quad (4)$$

Thus, a voltage Vout resulting from adding and averaging the voltages V1~V4 is represented by the following equation (5). In the voltage Vout, the variable a representing the voltage dependency of the offset value of the output voltage of the Hall element 10 and the voltage Voff are cancelled.

[Equation 5]

$$Vout = \left(\frac{r4-r3}{r3+r4} - \frac{r1-r2}{r1+r2} - \frac{r2-r4}{r2+r4} - \frac{r3-r1}{r1+r3}\right)Vcc \quad (5)$$

As described, according to the offset cancelling circuit 100 of the present embodiment, the offset value in the output voltage of the Hall element 10 can be suitably cancelled. In other words, the offset value which has the voltage dependency and the offset value which does not have the voltage dependency can both be cancelled.

What is claimed is:

1. An offset cancelling circuit of a Hall element, comprising:
    a group of first switching elements which exclusively switch and connect each of four terminals of the Hall element to a power supply voltage, a reference voltage, and an output terminal, and set the first state through the fourth state;
    an amplifier which amplifies the output voltage of the Hall element connected to the output terminal and outputs the amplified signal from an output terminal, for each of the first state through the fourth state;
    a group of second switching elements which connect the output terminal of the amplifier to capacitors which differ from each other for each of the first state through the fourth state; and
    a group of third switching elements which connect each terminal of the capacitors, and add and output charged voltages of the capacitors;
 wherein
    voltages are applied from four directions and from outside such that a current flowing in the Hall element is switched by 90° to achieve a first state through a fourth state, and output voltages of the Hall element in the first state through the fourth state are averaged.

* * * * *